US010598996B2

(12) United States Patent
Jian et al.

(10) Patent No.: US 10,598,996 B2
(45) Date of Patent: Mar. 24, 2020

(54) ARRAY SUBSTRATE INCLUDING THIN FILM TRANSISTOR HAVING SUB-CHANNEL REGIONS OF DIFFERENT WIDTHS, DISPLAY PANEL, AND DISPLAY DEVICE

(71) Applicants: Shanghai AVIC OPTO Electronics Co., Ltd., Shanghai (CN); Tianma Micro-Electronics Co., Ltd., Shenzhen (CN)

(72) Inventors: Shoufu Jian, Shanghai (CN); Zhaokeng Cao, Shanghai (CN); Zhiqiang Xia, Shanghai (CN)

(73) Assignees: SHANGHAI AVIC OPTO ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/404,369

(22) Filed: Jan. 12, 2017

(65) Prior Publication Data
US 2017/0125441 A1    May 4, 2017

(30) Foreign Application Priority Data

Sep. 27, 2016   (CN) .......................... 2016 1 0855825

(51) Int. Cl.
*G02F 1/1362* (2006.01)
*H01L 27/12* (2006.01)
(Continued)

(52) U.S. Cl.
CPC ...... *G02F 1/136286* (2013.01); *G02F 1/1368* (2013.01); *H01L 27/1222* (2013.01);
(Continued)

(58) Field of Classification Search
CPC . H01L 27/124; H01L 27/1222; G02F 1/1368; G02F 1/136286
See application file for complete search history.

(56) References Cited

U.S. PATENT DOCUMENTS

2005/0041169 A1* 2/2005 Hashimoto ........... G02F 1/1368
349/43
2011/0169001 A1* 7/2011 Ozeki ............... H01L 29/42384
257/59
(Continued)

FOREIGN PATENT DOCUMENTS

| CN | 1406368 A | 12/2001 |
| CN | 102130156 A | 1/2011 |

*Primary Examiner* — Matthew E. Gordon
(74) *Attorney, Agent, or Firm* — Anova Law Group PLLC (57) ABSTRACT

An array substrate, a display panel, and a display device are provided. The array substrate includes a substrate, and a plurality of scanning lines and a plurality of data lines disposed on the substrate. The plurality of scanning lines and the plurality of data lines are insulated and intersected to define a plurality of pixel units. Each pixel unit includes a thin film transistor and a pixel electrode, a gate electrode of the thin film transistor is electrically connected to a scanning line, a source electrode is electrically connected to a data line, and a drain electrode is electrically connected to the pixel electrode. An active layer of the thin film transistor includes at least one channel region including first sub-channel region and at least one second sub-channel region. A first width of the first sub-channel region is smaller than a second width of the second sub-channel region.

16 Claims, 9 Drawing Sheets

(51) Int. Cl.
*G02F 1/1368* (2006.01)
*H01L 29/786* (2006.01)

(52) U.S. Cl.
CPC .. *H01L 29/78645* (2013.01); *H01L 29/78696* (2013.01); *G02F 2001/13685* (2013.01); *G02F 2202/104* (2013.01)

(56) References Cited

U.S. PATENT DOCUMENTS

2015/0187796 A1* 7/2015 Zhao .................... H01L 27/124
 257/72
2017/0054029 A1* 2/2017 Koezuka ........... H01L 21/02557
2018/0136529 A1* 5/2018 Liang ................... H01L 27/124

\* cited by examiner

ARRAY SUBSTRATE INCLUDING THIN FILM TRANSISTOR HAVING SUB-CHANNEL REGIONS OF DIFFERENT WIDTHS, DISPLAY PANEL, AND DISPLAY DEVICE

CROSS-REFERENCES TO RELATED APPLICATIONS

This application claims priority of Chinese Patent Application No. 201610855825.0, filed on Sep. 27, 2016, the entire contents of which are hereby incorporated by reference.

FIELD OF THE INVENTION

The present disclosure generally relates to the field of liquid crystal display technology and, niece particularly, relates to an array substrate, a display panel and a display device.

BACKGROUND

With the development of display technologies, the display effect of liquid crystal display products is improved continuously and, thus, the application field of the liquid crystal display products is widely broadened.

The power consumption of the display products is proportional to the display is driving frequency. Thus, to reduce the power consumption of the display products, the display driving frequency needs to be reduced. However, in current display products, after the driving frequency is reduced, in a holding stage, the pixel electrode voltage may keep decreasing due to the existence of the leakage current, and display image flicker may easily occur, thus affecting the display effect.

The disclosed array substrate, display panel, and display device are directed to solving at least partial problems set forth above and other problems.

BRIEF SUMMARY OF THE DISCLOSURE

One aspect of the present disclosure provides an array substrate. The array substrate includes a substrate, and a plurality of scanning, lines and a plurality of data lines disposed on the substrate. The plurality of scanning lines and the plurality of data lines are insulated and intersected to define a plurality of pixel units. Each pixel unit includes a thin film transistor and a pixel electrode, a gate electrode of the thin film transistor is electrically connected to a scanning line, a source electrode of the thin film transistor is electrically connected to a data line, and a drain electrode of the thin film transistor is electrically connected to the pixel electrode of the pixel unit. An active layer of the thin film transistor includes at least one channel region, and the channel region includes a first sub-channel region and at least one second sub-channel region. Along a direction perpendicular to an extension direction of the channel region, the first sub-channel region has a first width, the second sub-channel region has a second width, and the second width is smaller than the first width.

Another aspect of the present disclosure provides a display panel including an array substrate. The array substrate includes a substrate, and a plurality of scanning lines and a plurality of data lines disposed on the substrate. The plurality of scanning lines and the plurality of data lines are insulated and intersected to define a plurality of pixel units. Each pixel unit includes a thin film transistor and a pixel electrode, a gate electrode of the thin film transistor is electrically connected to a scanning line, a source electrode of the thin film transistor is electrically connected to a data line, and a drain electrode of the thin film transistor is electrically connected to the pixel electrode of the pixel unit. An active layer of the thin film transistor includes at least one channel region, and the channel region includes a first sub-channel region and at least one second sub-channel region. Along a direction perpendicular to an extension direction of the channel region, the first sub-channel region has a first width, the second sub-channel region has a second width, and the second width is smaller than the first width.

Other aspects of the present disclosure can be understood by those skilled in the art in light of the description, the claims, and the drawings of the present disclosure.

BRIEF DESCRIPTION OF THE DRAWINGS

To make more clearly the explanation of technical solutions in embodiments of the present disclosure or current techniques, drawings needed in the embodiments or current techniques are briefly illustrated below. Apparently, the drawings described below only correspond to some embodiments of the present disclosure, and it is possible for those ordinarily skilled in the art to derive other drawings from the accompanying drawings without creative effort.

DETAILED DESCRIPTION

The present disclosure will now be described in more detail hereinafter with reference to exemplary embodiments thereof as shown in the accompanying drawings. It should be understood that the exemplary embodiments disclosed herein are for illustrative purpose only, and are not intended to limit the present disclosure. In addition, it should be noted that, for ease of description, the accompanying drawings merely illustrate a part of, but not all structures related to the present disclosure.

As discussed above, in existing display products, after the driving frequency is reduced, in a holding stage, the pixel electrode voltage may keep decreasing due to the existence of the leakage current, and display image flicker may easily occur, thus affecting the display effect.

Directed to solving at least partial problems set forth above and other problems, the present disclosure provides an improved array substrate, display panel, and display device. According to the present disclosure, by configuring at least one second sub-channel region with a relatively small with in the thin film transistor on the array substrate, the resistance of the thin film transistor is increased. Further, because the voltage between the two ends of the thin film transistor is fixed, the leakage current of the thin film transistor may be reduced, and the variance of the pixel electrode voltage may be decreased. Accordingly, the flicker of the display image caused by a large reduction in the pixel electrode voltage may be avoided, thus improving the low-frequency driving display effect.

Figure 1:
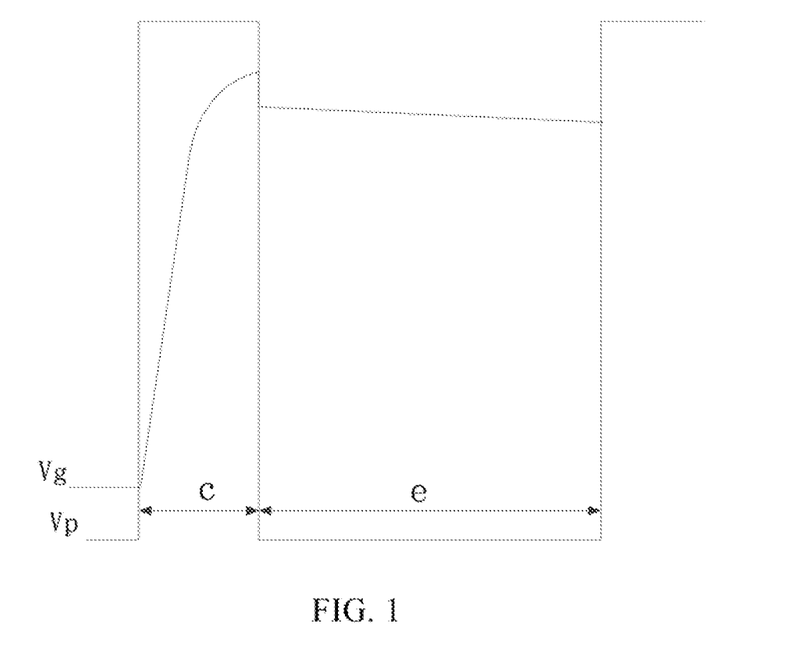
FIG. 1 illustrates pixel electrode voltage variation in an exemplary frame consistent with disclosed embodiments.

FIG. 1 illustrates pixel electrode voltage variation in an exemplary frame consistent with disclosed embodiments. As shown in FIG. 1, Vg represents a gate electrode driving signal supplied to scanning lines, and Vp represents a pixel electrode voltage. In general, display of each frame may be divided into a charging stage c and a holding stage e. In the charging stage c, the gate electrode driving signal Vg may be a high voltage level, and a thin film transistor connected to the pixel electrode may be switched on to charge the pixel electrode. Thus, the pixel electrode voltage Vp may become a corresponding grey-scale voltage. That is the writing of the information to be displayed by the whole image may be completed. In the holding stage e, the scanning lines may supply a certain direct current signal or may not supply any signal, and the thin film transistor may be switched off till the next frame signal begins.

Because of the influence of the leakage current, in the holding stage e, electric charges of the pixel electrode may be leaked through the thin film transistor, and the pixel electrode voltage Vp may keep decreasing with the time if the driving frequency of the display panel is reduced, then the duration of the holding stage e may be increased, and the reduction in the pixel electrode voltage Vp may be relatively large. Accordingly, in the holding stage, the pixel electrode voltage Vp may fail to satisfy the requirements of image display, and image flicker may easily occur, thus affecting the display effect.

Figure 2:
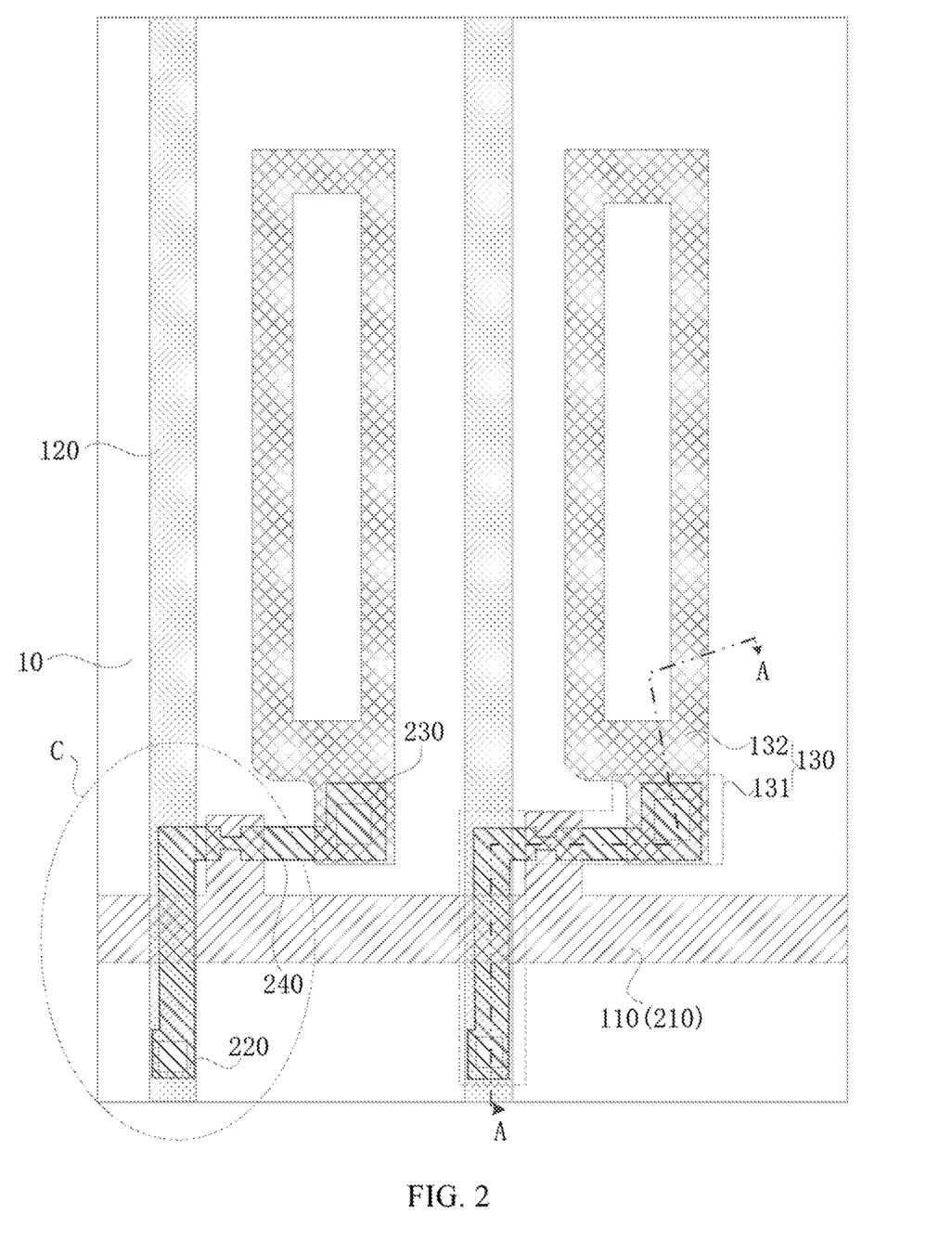
FIG. 2 illustrates an exemplary array substrate consistent with disclosed embodiments.
Figure 3:
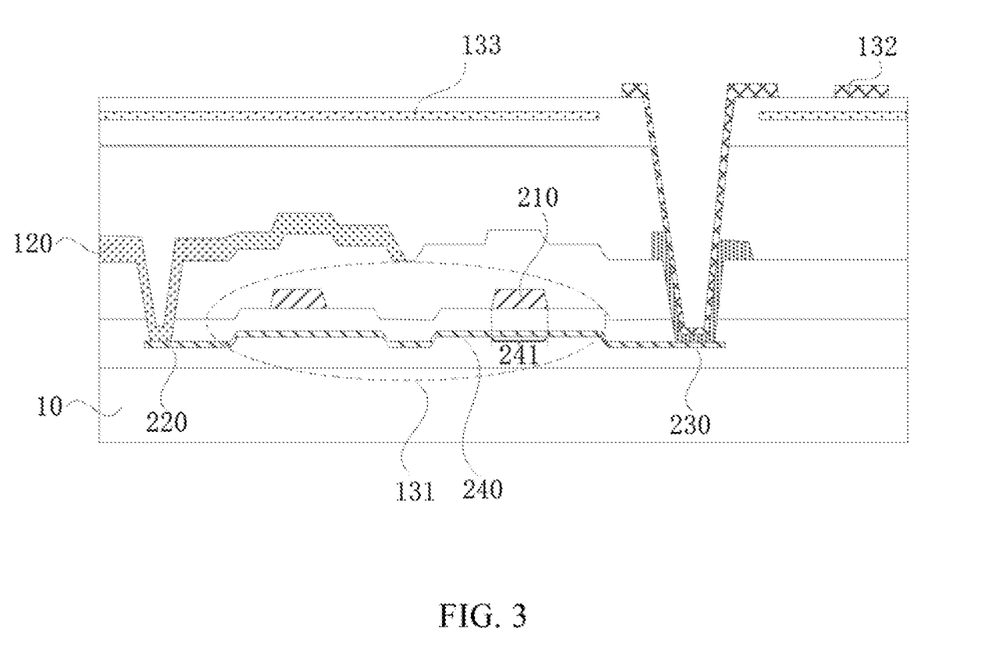
FIG. 3 illustrates an A-A cross-sectional view of an exemplary array substrate in FIG. 2 consistent with disclosed embodiments.

FIG. 2 illustrates an exemplary array substrate consistent with disclosed embodiments. FIG. 3 illustrates an A-A cross-sectional view of an exemplary array substrate in FIG. 2 consistent with disclosed embodiments. Referring to FIG. 2 and FIG. 3, the array substrate may include a substrate 10, a plurality of scanning lines 110 disposed on the substrate 10, and a plurality of data lines 120 disposed on the substrate 10. The plurality of scanning lines 110 and the plurality of data lines 120 may be insulated and intersected to define a plurality of pixel units 130.

Referring to FIG. 2, the pixel unit 130 may include a thin film transistor 131 and a pixel electrode 132. The thin film transistor 131 may include a gate electrode 210, a source electrode 220, and a drain electrode 230. The gate electrode 210 may be electrically connected to the scanning line 110, the source electrode 220 may be electrically connected to the data line 120, and the drain electrode 230 may be electrically connected to the pixel electrode 132, Further, referring to FIG. 3, the pixel unit 130 may also include a common electrode 133 (not shown in FIG. 2).

Figure 4:
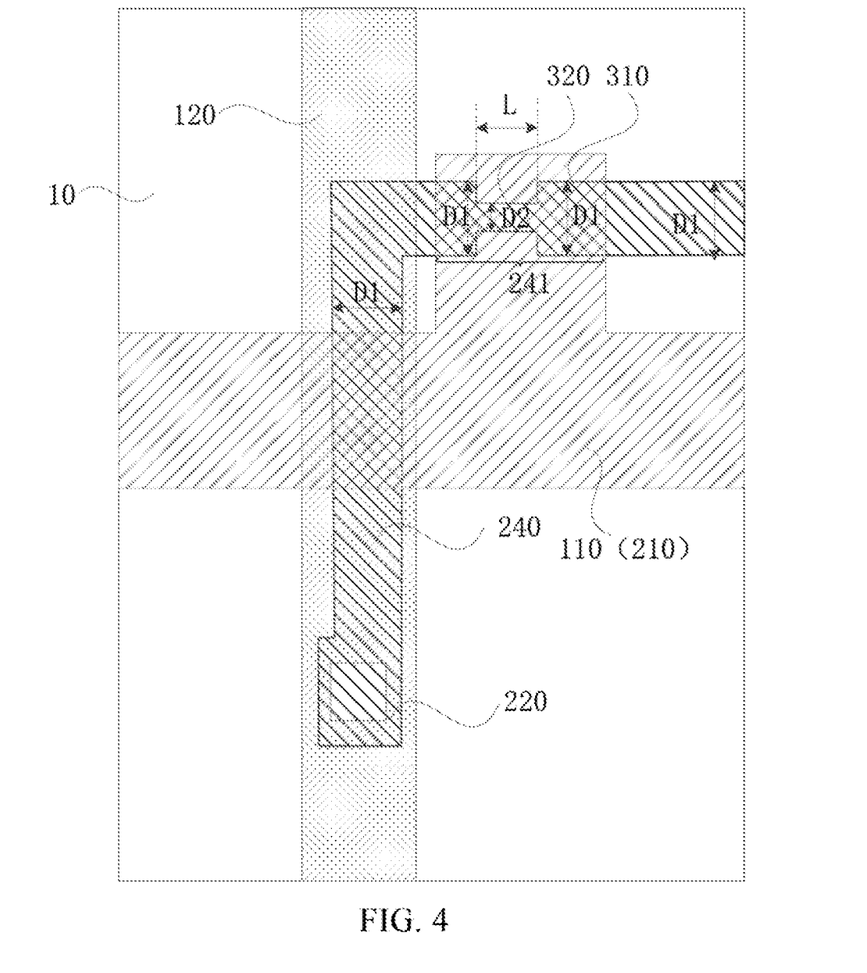
FIG. 4 illustrates a partially enlarged view of an exemplary array substrate in FIG. 2 consistent with disclosed embodiments.

FIG. 4 illustrates an enlarged view of an exemplary array substrate in FIG, 2 consistent with disclosed embodiments. Specifically, FIG. 4 illustrates an enlarged view of a region C in FIG. 2. Referring to FIG. 3 and FIG. 4, an active layer 240 of the thin film transistor 131 may include at least one channel region 241. The channel region 241 may include a first sub-channel region 310 and at least one second sub-channel region 320. In particular, along, the direction perpendicular to an extension direction of the channel region 241, the first sub-channel region 310 may have a first width D1, the second sub-channel region 320 may have a second width D2, and the second width D2 may be smaller than the first width D1.

Further, the gate electrode 210 of the thin film transistor 131 and the scanning line 110 may be fabricated using the same process. The gate electrode 210 may be a part of the scanning line 110. As shown in FIG. 2 and FIG. 4, the gate electrode 210 and the scanning line 110 are not differentiated. Further, the gate electrode 210 may overlap with the active layer 240. The channel region 241 of the thin film transistor 131 may be an overlapping region between the active layer 240 of thin film transistor 131 and the scanning line 110 (or the gate electrode 210).

Further, the width of the channel region 241 of the thin film transistor 131 may be inversely proportional to the resistance of the thin film transistor 131. That is, when the width of the channel region 241 decreases, the resistance of the thin film transistor 131 may increase correspondingly. In one embodiment, at least one second sub-channel region 320 with a relatively small width may be disposed in the channel region 241 of the thin film transistor 131, thus increasing the resistance of the thin film transistor 131. Further, because the voltage between two ends of the thin film transistor 131 is fixed, the leakage current of the thin film transistor 131 may be reduced and the variance of the pixel electrode voltage may be decreased. Accordingly, the flicker of the display image caused by a large reduction in the pixel electrode voltage may be avoided, thus improving the low-frequency driving display effect. Thus, the thin film transistor 131 may adopt a lower driving frequency, and the power consumption of the display panel may be reduced.

Optionally, the ratio of the second width D2 to the first width D1 may be less than or equal to 0.6. Specifically, under the condition that the first width D1 is fixed, the smaller the ratio of the second width D2 to the first width D1 the higher the resistance of the thin film transistor 131. By configuring the ratio of D2 to D1 to be less than or equal to 0.6, the second sub-channel region 320 may be ensured to have a relatively small width. Accordingly, the thin film transistor 131 may be ensured to have a relatively large resistance, and the leakage current of the thin film transistor 131 may be reduced.

Further, the ratio of the length L of the second sub-channel region 320 along the extension direction of the channel region 241 to the first width D1 may be greater than 0.25 and less than 2. Specifically, under the condition that the width D2 of the second sub-channel region is fixed, the longer the length L of the second sub-channel region 320, the higher the resistance of the thin film transistor 131. By configuring the ratio of the length L to the first width DI to be greater than 0.25 and less than 2, once the requirements of existing processes are satisfied, the second sub-channel region 320 may be ensured to have a considerable length. Accordingly, the resistance of the thin film transistor 131 may be maximally increased, the leakage current may be reduced, and the flicker of the display image caused by a large reduction in the pixel electrode voltage may be avoided, thus improving the low-frequency driving display effect.

Optionally, the first width D1 may be within a range of approximately 2-4 micrometers. Specifically, by configuring the first width D1 to be within a range of approximately 2 to 4 micrometers, the channel region 241 of the thin film transistor 131 may be ensured to have a relatively small width. Accordingly, the resistance of the thin film transistor 131 may overall be increased, the leakage current of the thin film transistor 131 may be reduced, and the low-frequency driving display effect may be improved.

The disclosed values or ranges of the first width D1, the second width D2, and the length L may be desired values or ranges under existing processing conditions. However, the present disclosure is not intended to limit the values or ranges of D1, D2, and L. That is, if allowed by the processing conditions, the first width D1 and the second width D2 may be configured to be smaller, and the length L may be configured to be longer.

Optionally, along the direction perpendicular to the extension direction of the channel region 241, a non-channel region of the active layer in the thin film transistor 131 may have the first width D1. In particular, the non-channel region may be the region other than the channel region 241 in the active layer 240. Because the non-channel region and the first sub-channel region 310 have the same width, the processing difficulty when fabricating the active layer 240 may be reduced. Further, the non-channel region may have a relatively narrow width, Urns reducing the resistance of the thin film transistor 131.

In one embodiment, optionally, the first sub-channel region 310 and the second sub-channel region 320 may be connected. Because the width of the channel region 241 in the joint between the first sub-channel region 310 and the second sub-channel region 320 may change abruptly, the resistance of the channel region 241 may be reduced more easily. FIG. 4 illustrates an exemplary array substrate consistent with disclosed embodiments. Specifically, FIG. 4 illustrates an exemplary method for connecting, the first sub-channel region 310 with the second sub-channel region 320.

As shown in FIG. 4, the condition that the width of the channel region 241 suddenly changes from the first width D1 to the second width D2 may not be intended to limit the present disclosure. In some embodiments, other methods for connecting the first sub-channel region 310 with the second sub-channel region 320 may be disclosed.

Figure 5:
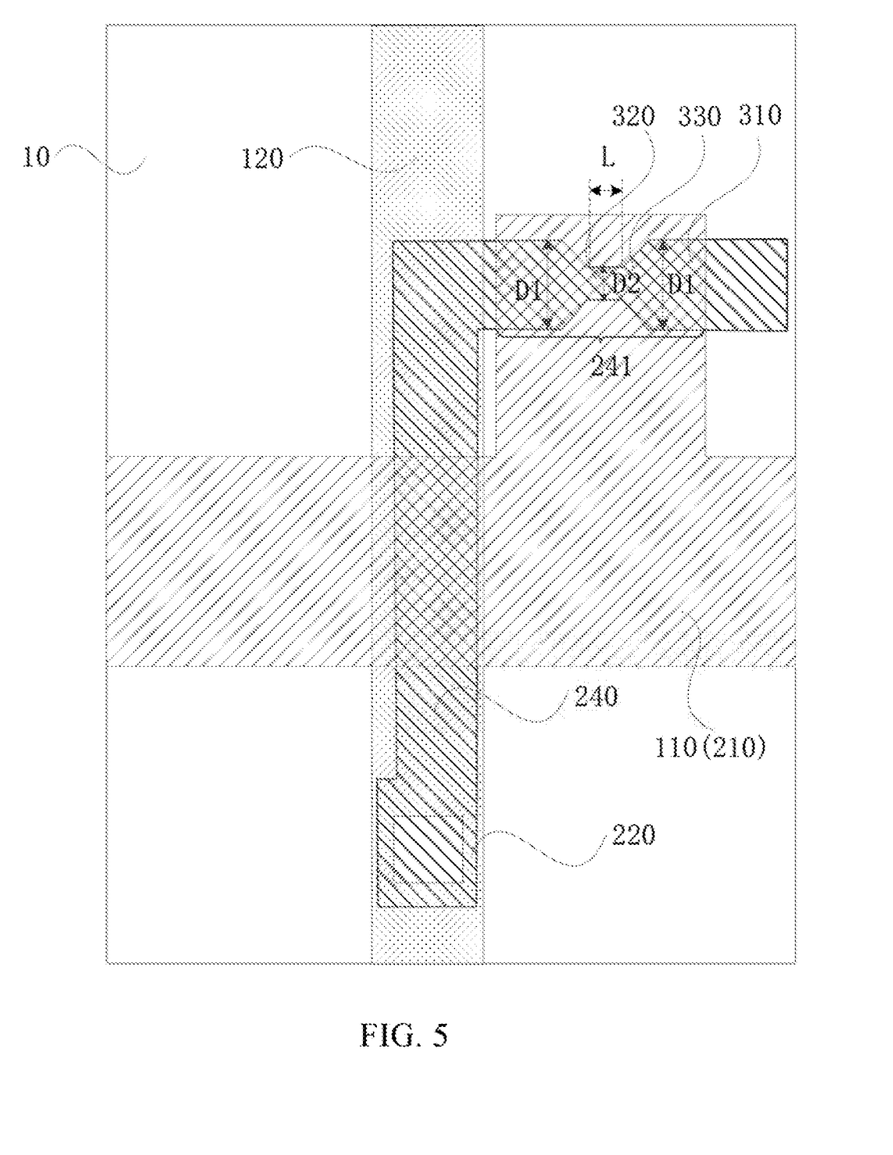
FIG. 5 illustrates a partially enlarged view of another exemplary array substrate consistent with disclosed embodiments.

FIG. 5 illustrates a partially enlarged view of another exemplary array substrate consistent with disclosed embodiments. Referring to FIG. 5, a third sub-channel region 330 may be disposed between the first sub-channel region 310 and the second sub-channel region 320. Along the extension direction of the channel region 241, the width of the third sub-channel region 330 along the direction perpendicular to the extension direction of the channel region 241 may gradually change from the first width D1 to the second width D2. In particular, one side of the third sub-channel region 330 having the first width DI may be connected to the first sub-channel region 310, and one side of the third sub-channel region 330 having the second width D2 may be connected to the second sub-channel region 320.

Specifically, by configuring the third sub-channel region 330 as a width transition region between the first sub-channel region 310 and the second sub-channel region 320, the processing difficulty of the fabrication of the active layer 240 may be reduced. Further, when the width D1 and the length L of the second sub-channel region 320 are fixed, by providing the third sub-channel region 330, the width of the channel region 240 of the thin film transistor 131 may be further decreased, and the leakage current may be further reduced.

Further, FIG. 5 merely illustrates the situation where the width of the third sub-channel region 330 gradually and linearly changes from the first width Di to the second width D2. That is, FIG. 5 merely illustrates the situation where two external sides of the third channel region 330 are straight lines. However, the present disclosure is not limited thereto. In other embodiments, the two external sides of the third channel region 330 may have other shapes. For example, the two external sides may be arc-shaped.

Figure 6:
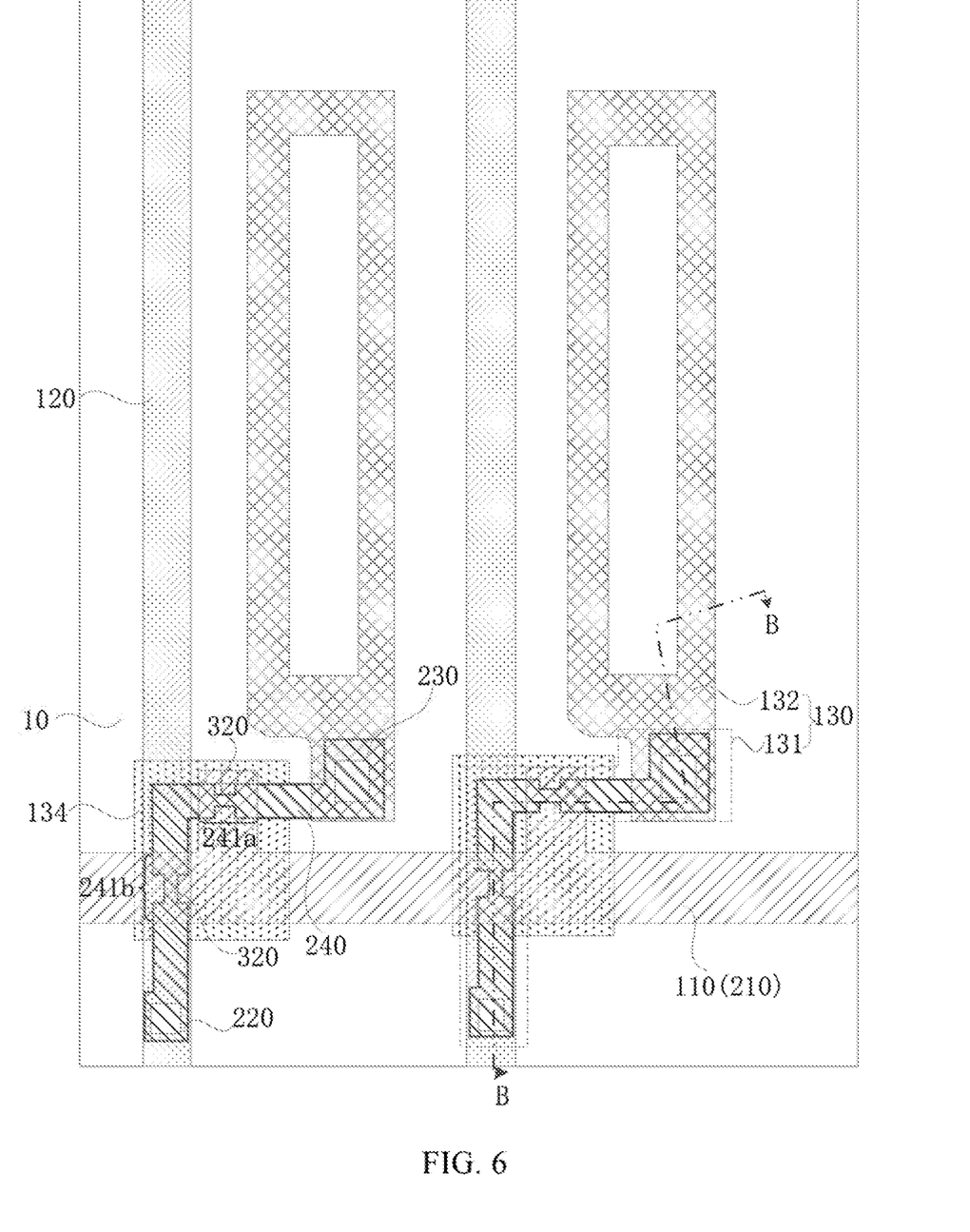
FIG. 6 illustrates another exemplary array substrate consistent with disclosed embodiments.

FIG. 6 illustrates another exemplary array substrate consistent with disclosed embodiments. Referring to FIG. 6, the active layer 240 of the thin film transistor 131 may have a first channel region 241a and a second channel region 241b. In an extension direction of the First channel region 241a, the first channel region 241a may have at least one second sub-channel region 320. In an extension direction of the second channel region 241b, the second channel region 241b may have at least one second sub-channel region 320.

Specifically, by configuring the thin film transistor 131 to have two channel regions, the total length of the channel region of the thin film transistor 131 may be increased. Thus, the resistance of the thin film transistor 131 may be further increased, and the leakage current of the thin film transistor 131 may be reduced. Further, by configuring at least one second sub-channel region 320 in the first channel region 241a as well as in the second channel region 241b, the length of the area with a relatively small width in the whole channel region may be increased. Thus, the resistance of the thin film transistor 131 may be increased, and the leakage current of the thin film transistor 131 may be reduced. Accordingly, the variance of the pixel electrode voltage may be reduced, and the flicker of the display image caused by a large reduction in the pixel electrode voltage may be avoided, thus improving the low-frequency driving display effect.

Figure 7:
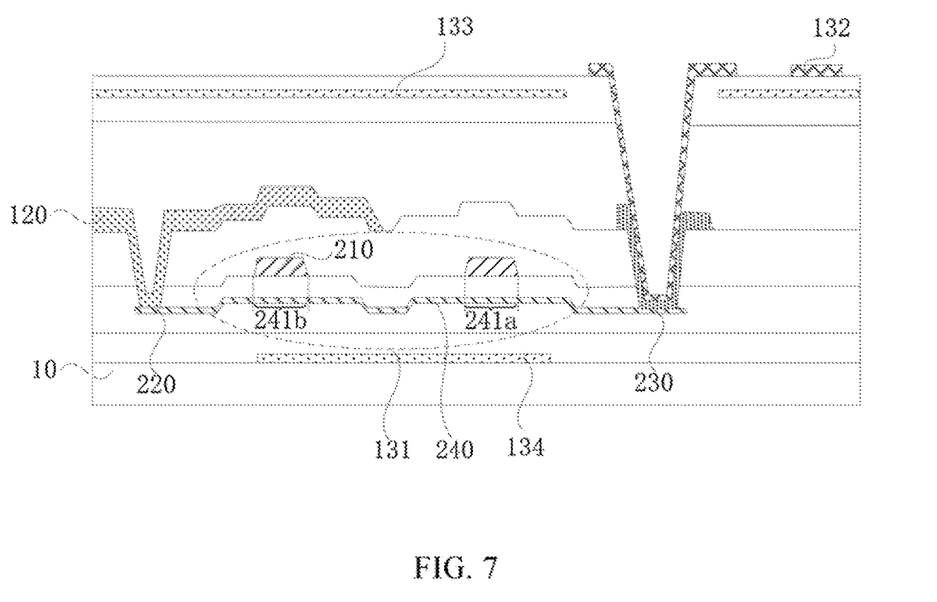
FIG. 7 illustrates a BB cross-sectional view of an exemplary array substrate in FIG. 6 consistent with disclosed embodiments.

FIG. 7 illustrates a B-B cross-sectional view of an exemplary array substrate in FIG. 6 consistent with disclosed embodiments. Referring to FIG. 7, the thin film transistor 131 may be a top gate electrode, and the channel region of the thin film transistor 131 may be disposed on one side of the gate electrode 210 facing towards the substrate 10. Thus, the gate electrode 210 may shield the channel region of the thin film transistor 131. Accordingly, when light emits from one side of the active layer 240 facing towards pixel electrode 132, an increase in the leakage current caused by photon-generated carriers induced by light irradiating the channel region may be avoided.

Further, the pixel unit 130 may also include a light-shielding layer 134, and the light-shielding layer 134 may be disposed on one side of the channel region of the thin film transistor 131 facing towards the substrate 10. The vertical projection of the light-shielding layer 134 on the substrate 10 may cover the vertical projection of the channel region of the thin film transistor 131 on the substrate 10. Specifically, by configuring the light-shielding layer 134 to shield the channel region of the thin film transistor 131, when light emits from one side of the active layer 240 facing towards the substrate 10, the photocurrent induced by light irradiating the channel region may be avoided. Thus, the properties of the thin film transistor 131 may be improved, and electric leakage brought by the photocurrent may be avoided. Further, the variance of the pixel electrode voltage may be reduced, and the low-frequency driving display effect may be improved.

Optionally, the thin film transistor 131 may be a low-temperature poly-silicon (LTPS) thin film transistor. Specifically, the low-temperature poly-silicon thin film transistor may have a relatively high electron transfer rate, thus the response rate of the thin film transistor 131 may be relatively fast, and the charge and discharge rate of the pixel unit 130 may not be affected after the width of the channel region of the thin film transistor 131 decreases. Further, by using the low-temperature poly-silicon thin film transistor, the region occupied by the thin film transistor 131 may be smaller and thinner. Accordingly, not only the power consumption of the display panel may be reduced, but also a relatively high aperture ratio of the pixel unit may be guaranteed.

The above-described embodiments merely illustrate the present disclosure using an array substrate in a liquid crystal display panel as an example. However, the present disclosure is not limited thereto, in some other embodiments, the array substrate may be applied in a self-light emitting display panel such as an organic light emitting display panel.

Figure 8:
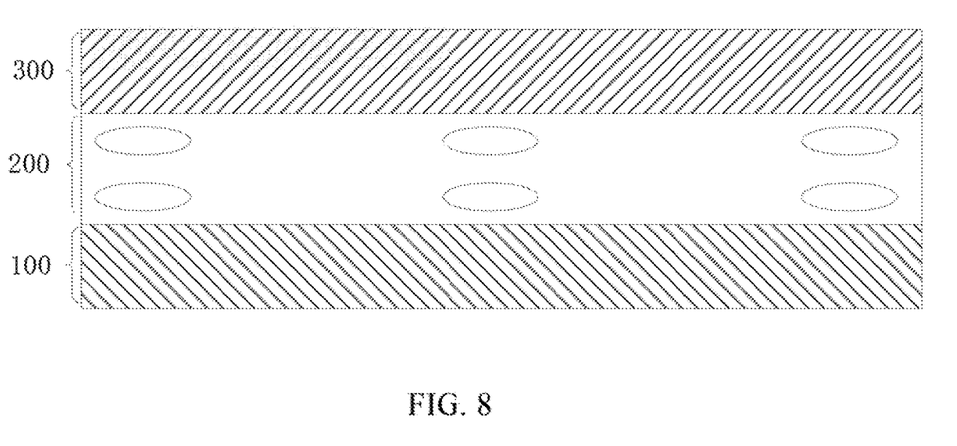
FIG. 8 illustrates an exemplary display and consistent with disclosed embodiments.

The present disclosure also provides a display panel. FIG. 8 illustrates an exemplary display panel consistent with disclosed embodiments. As shown in FIG. 8, the disclosed display panel may include an array substrate 100 described in any above embodiment of the present disclosure. Further, the display panel may also include a color film substrate 300 arranged opposite to the array substrate 100, and a liquid crystal layer 200 sandwiched between the array substrate 100 and the color film substrate 300.

Figure 9:
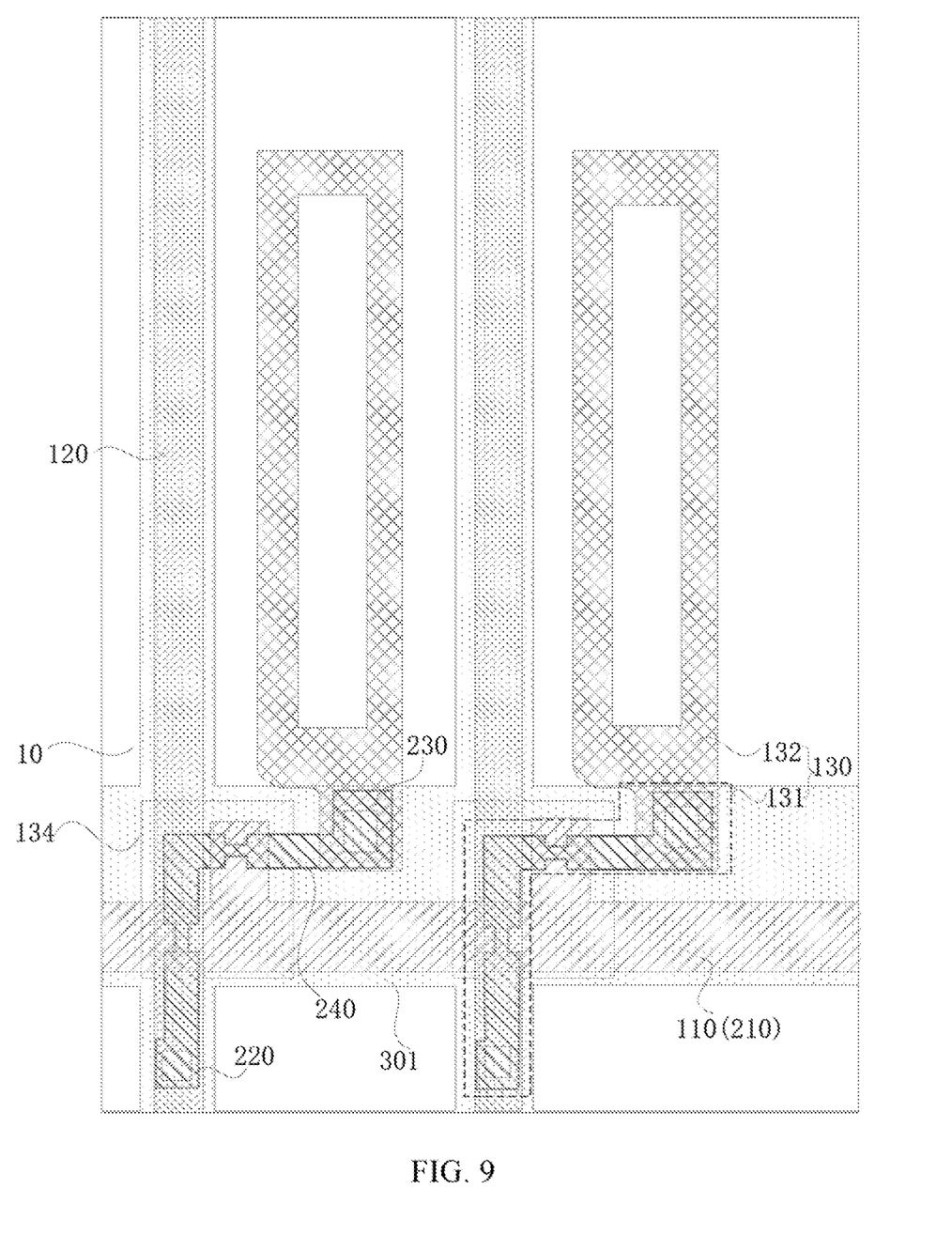
FIG. 9 illustrates a partially perspective view of an exemplary display panel consistent with disclosed embodiments.

FIG. 9 illustrates a partially perspective view of an exemplary display panel consistent with disclosed embodiments. As shown in FIG. 9, a black matrix (i.e., a light shielding matrix) 301 may be disposed or the color film substrate, and a vertical projection of in the thin film transistor 131 on the color film substrate 300 may be inside the black matrix 301.

Optionally, the image refresh frequency range of the display panel may be approximately 0.5 Hz-45 Hz. When the image refresh frequency is greater than 45 Hz, the power consumption of the display panel may be relatively high, resulting in the depletion of resources and energies. However, the disclosed display panel with a structure designed according to any above-described embodiment may effectively reduce the image refresh frequency, and simultaneously maintain stable display images when the display panel operates at a relatively low frequency. Accordingly, a relatively high image display quality may be ensured, and simultaneously the power consumption of the display panel may be reduced.

In the disclosed display panel, by configuring at least one second sub-channel region with a relatively small width in the thin film transistor disposed on the array substrate, the resistance of the thin film transistor may be increased. Because the voltage between the two ends of the thin film transistor is fixed, the leakage current of the thin film transistor may be reduced, and the variance of the pixel electrode voltage may be decreased. Accordingly, the flicker of the display image caused by a large reduction in the pixel electrode voltage may be avoided, thus improving the low-frequency driving display effect. Thus, the thin film transistor may use a lower driving frequency, and the power consumption of the display panel may be reduced.

Figure 10:
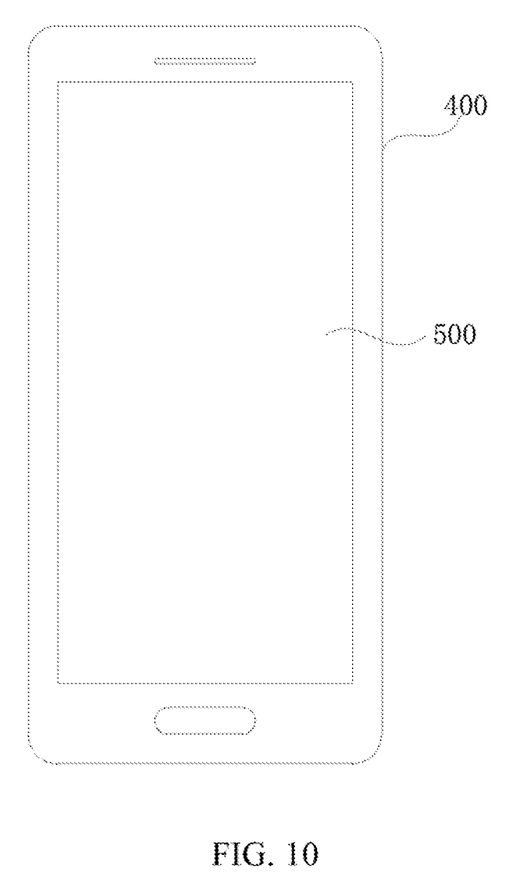
FIG. 10 illustrates an exemplary display device consistent with disclosed embodiments.

The present disclosure also provides a display device. FIG. 10 illustrates an exemplary display device consistent with disclosed embodiments. As shown in FIG. 10, the display device 400 may include a display panel 500 illustrated in any above-described embodiment. In particular, the display device 400 may be a cellphone shown in FIG. 10, a computer, a TV station, or a smart wearable display device, etc. The present disclosure is not intended to limit the specific type of the display device.

It should be noted that, the above detailed descriptions illustrate merely preferred embodiments of the present disclosure as well as technologies and principles applied herein. Those skilled in the an can understand that the present disclosure is not limited to the specific embodiments described herein, and numerous significant alterations, modifications and alternatives may be devised by those skilled in the art without departing from the spirit and scope of the present disclosure. Thus, although the present disclosure has been illustrated in above-described embodiments in details, the present disclosure is not limited to the above embodiments. Any equivalent or modification thereof, without departing from the spirit and principle of the present invention, falls within the true scope of the present invention, and the scope of the present disclosure is defined by the appended claims.

What is claimed is:

1. An array substrate, comprising:
a substrate; and
a plurality of scanning lines and a plurality of data lines disposed on the substrate, the plurality of scanning lines and the plurality of data lines being insulated and intersected to define a plurality of pixel units, wherein:
a pixel unit includes a thin film transistor and a pixel electrode, a gate electrode of the thin film transistor is electrically connected to a scanning line of the plurality of scanning lines, a source electrode of the thin film transistor is electrically connected to a data line of the plurality of data lines, and a drain electrode of the thin film transistor is electrically connected to the pixel electrode of the pixel unit,
an active layer of the thin film transistor includes a first channel region and a second channel region, the first channel region includes a first sub-channel region and at least one second sub-channel region, the second channel region includes a third sub-channel region and at least one fourth sub-channel region, and a longitudinal direction of the first channel region is perpendicular to a longitudinal direction of the second channel region,
the gate electrode is a part of the scanning line and overlapped with the active layer, thereby forming an overlapping region on the active layer, and the first channel region is disposed within the overlapping region,
along a direction perpendicular to a longitudinal direction of the first channel region, the first sub-channel region has a first width, the at least one second sub-channel region has a second width, and the second width is smaller than the first width,
a ratio of a length of the at least one second sub-channel region in the longitudinal direction of the first channel region to the first width of the first sub-channel region is greater than 0.25 and smaller than 2, and
a light-shielding layer is disposed on one side of the thin film transistor facing the substrate, the light-shielding layer non-overlapping with the source electrode and the drain electrode along a direction perpendicular to the substrate.

2. The array substrate according to claim 1, wherein:
a ratio of the second width to the first width is less than or equal to 0.6.

3. The array substrate according to claim 1, wherein:
a range of the first width is approximately 2-4 micrometers.

4. The array substrate according to claim 1, wherein:
in the direction perpendicular to the longitudinal direction of the first channel region, a non-channel region of the active layer of the thin film transistor has the first width.

5. The array substrate according to claim 1, wherein:
the first sub-channel region is connected to the at least one second sub-channel region.

6. The array substrate according to claim 1, wherein:
a third sub-channel region is disposed between the first sub-channel region and the at least one second sub-channel region;
along the longitudinal direction of the first channel region, a width of the third sub-channel region along the direction perpendicular to the longitudinal direction of the first channel region gradually changes from the first width to the second width; and
one side of the third sub-channel region with the first width is connected to the first sub-channel region, and one side of the third sub-channel region with the second width is connected to the at least one second sub-channel region.

7. The array substrate according to claim 1, wherein:
the pixel unit further includes the light-shielding layer, and a vertical projection of the light-shielding layer on the substrate covers a vertical projection of the first channel region of the thin film transistor on the substrate.

8. The array substrate according to claim 1, wherein:
the thin film transistor is a top gate structure, and the first channel region of the thin film transistor is disposed on one side of the gate electrode facing towards the substrate.

9. The array substrate according to claim 1, wherein:
the thin film transistor is a low temperature poly-silicon thin film transistor.

10. The array substrate according to claim 1, wherein:
the scanning line is disposed between the source electrode and the drain electrode along a longitudinal direction of the data line.

11. A display panel comprising an array substrate, wherein the array substrate includes:
a substrate; and
a plurality of scanning lines and a plurality of data lines disposed on the substrate, the plurality of scanning lines and the plurality of data lines being insulated and intersected to define a plurality of pixel units, wherein:
a pixel unit includes a thin film transistor and a pixel electrode, a gate electrode of the thin film transistor is electrically connected to a scanning line of the plurality of scanning lines, a source electrode of the thin film transistor is electrically connected to a data line of the plurality of data lines, and a drain electrode of the thin film transistor is electrically connected to the pixel electrode of the pixel unit,
an active layer of the thin film transistor includes a first channel region and a second channel region, the first channel region includes a first sub-channel region and at least one second sub-channel region, the second channel region includes a third sub-channel region and at least one fourth sub-channel region, and a longitudinal direction of the first channel region is perpendicular to a longitudinal direction of the second channel region,
the gate electrode is a part of the scanning line and overlapped with the active layer, thereby forming an overlapping region on the active layer, and the first channel region is disposed within the overlapping region,
along a direction perpendicular to a longitudinal direction of the first channel region, the first sub-channel region has a first width, the at least one second sub-channel region has a second width, and the second width is smaller than the first width,
a ratio of a length of the at least one second sub-channel region in the longitudinal direction of the first channel region to the first width of the first sub-channel region is greater than 0.25 and smaller than 2, and
a light-shielding layer is disposed on one side of the thin film transistor facing the substrate, the light-shielding layer non-overlapping with the source electrode and the drain electrode along a direction perpendicular to the substrate.

12. The display panel according to claim 11, further comprising:
a color film substrate arranged opposite to the array substrate; and
a black matrix disposed on the color film substrate,
wherein a vertical projection of the thin film transistor on the color film substrate is located inside the black matrix.

13. The display panel according to claim 11, wherein:
an image refresh frequency of the display panel is approximately 0.5 Hz-45 Hz.

14. A display device, comprising the display panel according to claim 11.

15. The display panel according to claim 11, wherein:
the scanning line is disposed between the source electrode and the drain electrode along a longitudinal direction of the data line.

16. The display panel according to claim 11, wherein:
a vertical projection of the light-shielding layer on the substrate covers a vertical projection of the first channel region of the thin film transistor on the substrate.

* * * * *